United States Patent [19]

Mahulikar et al.

[11] Patent Number: 5,122,858
[45] Date of Patent: Jun. 16, 1992

[54] LEAD FRAME HAVING POLYMER COATED SURFACE PORTIONS

[75] Inventors: Deepak Mahulikar, Madison; Julius C. Fister; Gerald N. Violette, both of Hamden, all of Conn.

[73] Assignee: Olin Corporation, New Haven, Conn.

[21] Appl. No.: 580,696

[22] Filed: Sep. 10, 1990

[51] Int. Cl.$^5$ .................. H01L 23/14; H01L 23/50
[52] U.S. Cl. .................. 357/70; 357/72
[58] Field of Search .................. 357/72, 70, 74

[56] References Cited

U.S. PATENT DOCUMENTS

| | | | |
|---|---|---|---|
| 4,428,987 | 1/1984 | Bell et al. | 427/327 |
| 4,452,650 | 6/1984 | Cauley | 148/31.5 |
| 4,461,924 | 7/1984 | Butt | 174/52.4 |
| 4,482,915 | 11/1981 | Nishikawa et al. | 357/72 |
| 4,521,469 | 6/1985 | Butt et al. | 428/35 |
| 4,525,422 | 6/1985 | Butt et al. | 428/418 |
| 4,589,010 | 5/1986 | Tateno et al. | 357/72 |
| 4,707,724 | 11/1987 | Suzuki et al. | 357/71 |
| 4,812,896 | 3/1989 | Rothgery et al. | 357/70 |
| 4,827,376 | 5/1989 | Voss | 361/388 |
| 4,839,857 | 7/1989 | Butt et al. | 361/388 |
| 4,855,807 | 8/1989 | Yamaji et al. | 357/72 |
| 4,862,246 | 8/1989 | Masuda et al. | 357/70 |
| 4,866,506 | 9/1989 | Nambu et al. | 357/72 |
| 4,888,449 | 12/1989 | Crane et al. | 174/52.4 |
| 4,916,518 | 4/1990 | Yoshimura | 357/70 |
| 4,939,316 | 7/1990 | Mahulikar et al. | 174/52.4 |
| 4,942,454 | 7/1990 | Mori et al. | 357/70 |
| 4,985,751 | 1/1991 | Siobara et al. | 357/72 |
| 5,013,871 | 5/1991 | Mahulikar | 174/52.4 |
| 5,023,398 | 6/1991 | Mahulikar | 174/52.4 |

FOREIGN PATENT DOCUMENTS

| | | | |
|---|---|---|---|
| 0154051 | 9/1984 | Japan | 357/72 |
| 0219948 | 12/1984 | Japan | 387/72 |
| 0073751 | 3/1989 | Japan | 357/72 |
| 0321664 | 12/1989 | Japan | 357/72 |
| 0063148 | 3/1990 | Japan | 357/72 |

OTHER PUBLICATIONS

Park, Jae Myung, *Improvement of Copper/Epoxy Bond Durability by Chemical Bonding*. Doctorial Dissertation: The University of Connecticut 1983; at Capter 3-pp. 47-72.

*Primary Examiner*—Rolf Hille
*Assistant Examiner*—S. V. Clark
*Attorney, Agent, or Firm*—Gregory S. Rosenblatt; Paul Weinstein

[57] ABSTRACT

A composite leadframe for electronic packages is provided. A polymer layer coats a portion of the leadframe. The polymer layer increases the adhesive bond between the leadframe and a molding resin. Water vapor does not accumulate under the leads and die attach paddle minimizing the popcorn effect.

34 Claims, 3 Drawing Sheets

1

LEAD FRAME HAVING POLYMER COATED SURFACE PORTIONS

FIELD OF THE INVENTION

This invention relates generally to lead frames for molded plastic electronic packages. More particularly, the invention relates to methods for increasing the adhesion between the lead frame and the molding resin to minimize the entrapment of water vapor.

BACKGROUND OF THE INVENTION

Molded plastic packages are widely used to house microelectronic devices, such as silicon based semiconductor integrated circuits. The molded plastic packages are characterized by low cost, ease of assembly and adequate protection of the device from water vapor and other sources of corrosion. Usually, the device is mounted on a centrally positioned die attach paddle. The electronic device is then electrically interconnected to the inner ends of a plurality of leads which approach the die attach paddle from at least one side and up to all four sides of the paddle. Electrical interconnection is typically by wire bonding or tape automated bonding. Following electrical interconnection, the centrally positioned die attach paddle, electronic device and inner portion of the leadframe are encapsulated in a molding resin by a process such as transfer molding. The resin forms a hard, relatively moisture impervious shell protecting both the semiconductor device and the electrical connections.

Subsequent to encapsulation, the outer leads of the leadframe are frequently soldered to a printed circuit board or other external electrical device. During soldering, the temperature of the encapsulated package may rise to from about 200° C. to about 260° C. Particularly susceptible to temperature increases are leadless chip carriers such as plastic surface mount components. Any water vapor trapped within the package rapidly expands. One site for the accumulation of water is at the interface between the molding resin and the die attach paddle. When the accumulated water vapor expands, the base of the molded plastic package is deformed leading to what is known as the "popcorn effect".

When the popcorn effect is severe, the molding resin can fracture. The fractures form conduits allowing water vapor and other corrosives to accumulate in close proximity to the bonding wires and integrated circuit device. Water enters the package by many means. Exposure of the molding resin to moisture either before or after encapsulation can lead to a build-up of moisture within the package. The Institute for Interconnecting and Packaging Electronic Circuits (IPC) has recently proposed shipping plastic surface mount components in hermetic containers to prevent the build-up of moisture.

A second source of moisture is penetration along metal/plastic interfaces. The adhesion between the molding resin and the metallic leadframe is primarily mechanical in nature. Frequently, a gap exists between the metallic leadframe and the plastic encapsulant. Moisture travels through the gap and accumulates under the die attach paddle.

Various means have been proposed to limit the ingress of water vapor. U.S. Pat. No. 4,866,506 to Nambu et al. discloses forming a vent hole in the molding resin. The vent hole interconnects the backside of the die attach paddle with the atmosphere so moisture accumulating under the paddle will dissipate when heated. U.S. Pat. No. 4,855,807 to Yamaji et al discloses vent holes located along the tie bars which support the die attach paddle.

To minimize separation between the molding resin and the metallic leadframe, several means to improve the adhesion have been proposed. These solutions include both means to increase mechanical adhesion and chemical adhesion. To improve mechanical locking, various configurations of holes, grooves and hemispheres have been formed in both the leads and the die attach paddle. The holes and deformations increase the surface area of the leadframe component and also provide crevices for enhanced mechanical locking. For example, U.S. Pat. No. 4,862,246 to Masuda et al discloses forming a series of hemispherical depressions on the die attach paddle. These depressions increase the adhesion of the die attach paddle to the molding resin increasing the resistance to humidity.

A dull layer of nickel applied to a copper alloy leadframe has been found to increase the strength of an epoxy bond as disclosed in U.S. Pat. No. 4,888,449 to Crane et al. U.S. Pat. No. 4,707,724 to Suzuki et al. discloses coating the die attach paddle with an alloy of tin/nickel or iron/nickel will increase the adhesive strength and minimize peeling.

Certain chemical solutions also increase the adhesive strength of the bond between copper and a polymer. U.S. Pat. No. 4,428,987 to Bell et al discloses pretreating the copper surface to improve adhesion. The surface is electrolytically reduced and then coated with a solution such as benzotriazole.

While the prior art processes are effective to increase the adhesion between a molding resin and metal leadframe, the bond is still inadequate. Channels permit the ingress of water vapor. Absent complete sealing of the channels, popcorning is still a problem.

SUMMARY OF THE INVENTION

Accordingly, it is an object of the invention to provide improved adhesion between a metal leadframe and a polymer molding compound which will be suitable for preventing the ingress of moisture vapor along the metal/polymer interface. This is achieved by coating the leadframe with a polymer which has good adhesion to both the metallic leadframe and the molding resin. It is a feature of the invention that the inner lead portion of the leadframe is coated with the polymer except for the lead tips. The lead tips are preferably polymer free to facilitate wire bonding. Yet another feature of the invention is that at least the side of the die attach paddle opposite the electronic device is coated with polymer to prevent the accumulation of water vapor. Still another feature of the invention is that a layer of a second material may be disposed between the metal leadframe and polymer coating to increase bond strength. It is an advantage of the invention that the polymer coating is preferably an epoxy. The epoxy may be provided in either sheet form or as a liquid. Yet another advantage of the invention is that, following accelerated testing in a pressure cooker, a five times improvement in bond strength is noted after five hours.

In accordance with the invention, there is provided a composite leadframe for an electronic package. The leadframe core is a conductor having a plurality of leads with inner and outer portions. The inner lead portions define a central aperture. A first polymer coats at least a portion of the inner leads.

The objects, features and advantages discussed above will become more apparent from the specification and drawings which follow.

DETAILED DESCRIPTION OF THE INVENTION

Figure 1:
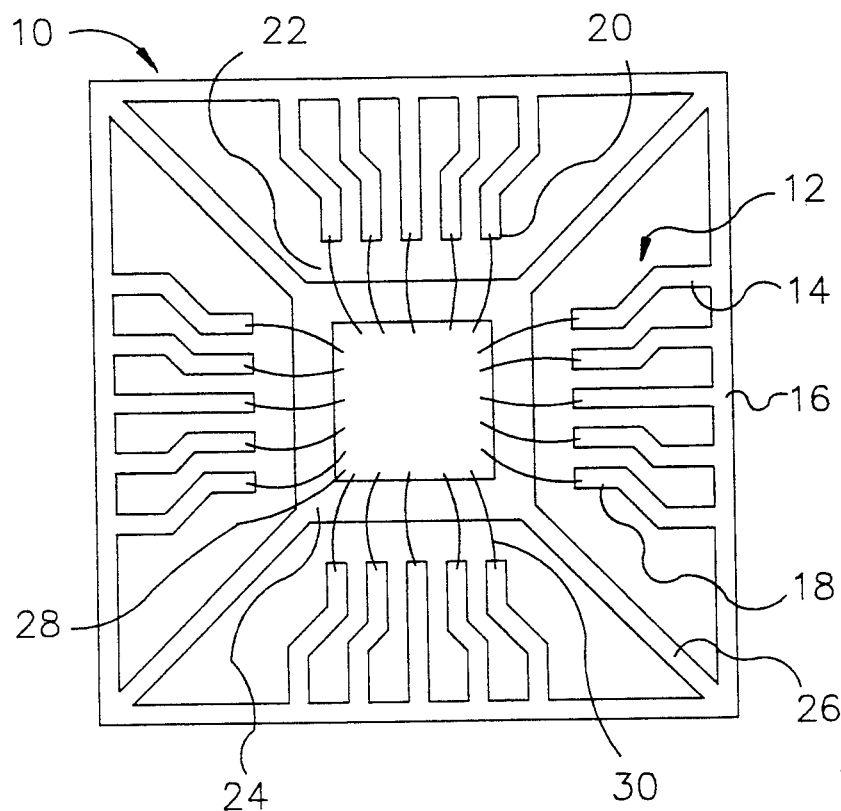
FIG. 1 shows in top planar view a leadframe including a centrally positioned die attach pad as known in the prior art.

FIG. 1 shows in top planar view a quad leadframe 10 as known in the prior art. The leadframe 10 contains a plurality of leads 12. The leads are made up of outer lead portions 14 supported by tie bar 16. The opposite ends of the leads 12 form inner leads 18. The inner leads 18 terminate at inner lead tips 20. The inner lead tips 20 serve to define a centrally positioned cavity 22.

A die attach paddle 24 is preferably located within the centrally positioned cavity 22. The die attach paddle provides a site for supporting an electronic device 28 in close proximity to the inner leads 18. The die attach paddle 24 is held in place by one or more tie bar supports 26. The tie bar supports 26 extend from the centrally positioned die attach paddle 24 to tie bars 16.

The leadframe 10 includes the leads 12 and die attach paddle 24. It may be manufactured from any electrically conductive material. The leadframe has a thickness of from about 0.005 to about 0.020 inches for packages having external leads. Most commonly, the leadframes are about 0.010 inches thick. For quad leadframes in surface mounted packages, the leadframe thickness is typically about 0.006 inches. For tape automated bonding (TAB) leadframes, the thickness may be as low as 0.0014 inches.

The leadframes are usually manufactured from iron/nickel containing alloys such as 42% nickel/remainder iron. The alloys have a coefficient of thermal expansion close to that of a semiconductor integrated circuit device. Alternatively, copper or copper based alloys are employed to exploit the high electrical and thermal conductivity of copper based materials. The composite leadframes of the present invention are equally suitable for iron/nickel containing alloys and copper based alloy leadframes as well as any other metallic material.

Bonded to the die attach paddle is an integrated circuit device 28. The device 28 is bonded to the die attach paddle by any conventional die attach material such as a low melting solder like lead/tin or eutectic solder like gold/tin or gold/silicon. Alternatively, an adhesive such as a silver filled epoxy may be used. When the leadframe is formed from copper or a copper based alloy, the die attach material is preferably compliant to compensate for coefficient of thermal expansion mismatch. Bond wires 30 electrically interconnect the integrated circuit device 28 to the inner lead tips 20. The bond wires may be thin aluminum, gold or copper wires or an etched copper foil such as employed in tape automated bonding.

The leadframe 10 with integrated circuit device 28 bonded to the centrally positioned die attach paddle 22 and electrically connected to the inner lead ends 20 is then encapsulated. The assembly is placed in a mold cavity and a suitable molding compound is introduced to the cavity such that the inner leads 18 and centrally positioned die attach paddle 24 are encapsulated. Typical molding resins are epoxies, silicones and urethanes. Epoxy resins are most widely used for device encapsulation. The epoxy resins are characterized by low shrinkage during curing, good adhesion to most surfaces, environmental stability and ease of processing. Epoxy novalacs incorporating phenolic curing agents are commonly used. Fillers such as silica or alumina may be added to the epoxy in concentrations of up to 75% to improve the properties of the molded package. The fillers reduce curing shrinkage, increase the strength of the epoxy, lower its thermal expansivity and in the case of alumina, increase thermal conductivity. The epoxies are generally colored black to maximize infrared radiation absorption. IR is typically used to solder the assembled package to a printed circuit board.

The epoxy resin is liquified in a hot chamber. Liquid resin is then forced by a ram into a heated mold containing the device being encapsulated and allowed to solidify and cure about the device. The entire process takes only a few minutes enabling high production rates.

Figure 2:
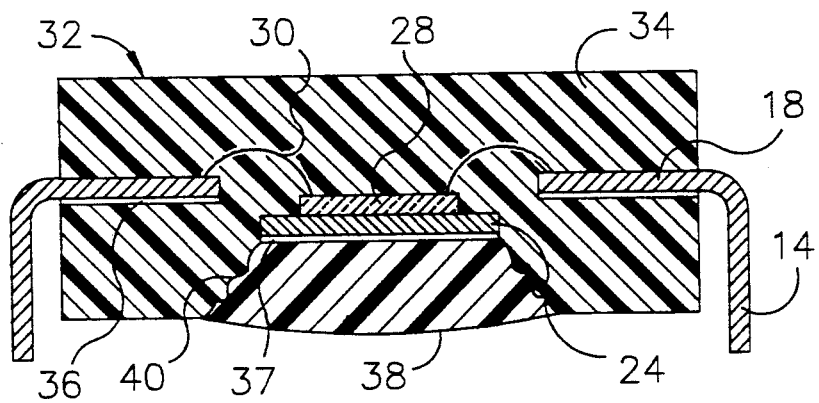
FIG. 2 shows in cross sectional representation a prior art molded plastic package damaged by the popcorn effect.

FIG. 2 shows a plastic encapsulated package 32 illustrating the moisture absorption problems of the prior art. The inner lead ends 18 and centrally positioned die attach paddle 24 are encapsulated within a block of molding resin 34. Adhesion between the metal lead frame and the molding resin 34 is not ideal. Also, the metal leadframe and polymer molding resin have different coefficients of thermal expansion. As both cool, they contract at different rates. As a consequence of the relatively poor adhesion between the metallic leadframe and the molding resin and the different coefficients of thermal expansion, a gap 36 may form between the metallic components and the molding resin. The gap serves as a channel for moisture and other contaminants into the sealed package. The gap also provides a site for the accumulation of moisture. Particularly, the gap 37 under the die attach paddle 24 is a problem. The gap 37 is a sealed cavity. Subsequent to molding, the package is frequently heated. For example, infrared radiation may be used to heat the outer leads 14 for soldering. The package 32 is heated to a temperature of from about 200° C. to about 260° C. The heat causes moisture trapped within the gap 36, 37 to expand. The expanding water vapor causes the base 38 of the package 32 to bulge. This bulging is commonly referred to as the popcorn effect. The bulging may be sufficiently severe to form fractures 40 in the molding resin 38.

The bulging and fractures are not desirable. Bulging changes the surface outline of the package and may prevent smooth insertion into a printed circuit board. Bulging is cosmetically unacceptable. The fractures 40 serve as a means for the ingress of moisture and corrosive elements to the die attach paddle 24 and integrated circuit device 28. The contaminants corrode the fine circuits formed on the face of the integrated circuit device as well as the bonding wires 30. The bulging can distort or break the brittle silicon based electronic device. Bulging can also cause the bond wires to fracture.

The popcorn effect Problem can be eliminated by preventing the accumulation of water vapor in the gap 37 below the die attach pad 24. The accumulation of water vapor is minimized by improving the adhesion between the molding resin 34 and the metallic leadframe. Applicants have achieved this objective by the composite leadframe of the invention.

An integrated circuit device 28 is electrically connected to inner lead tips 20 by bonding wires 30. The molding resin 34 encapsulates both the inner lead portions 18 and the device. If a die attach paddle 28 is used, it is fully encapsulated as well.

Figure 3:
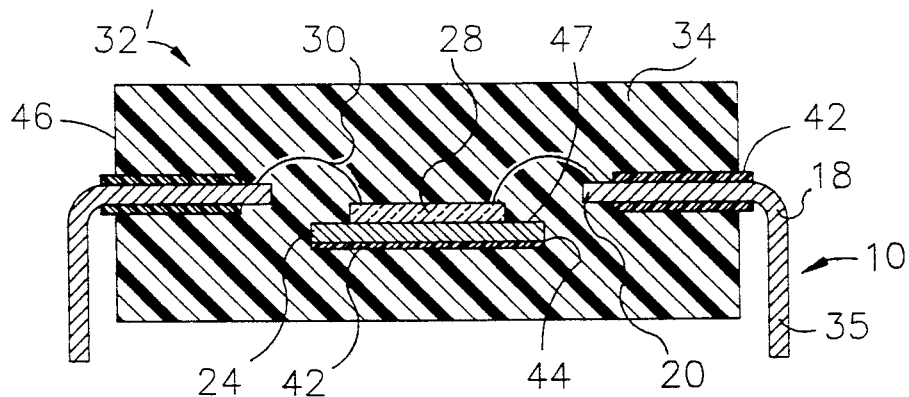
FIG. 3 shows in cross sectional representation a molded plastic electronic package including the composite leadframe of a first embodiment of the invention.

FIG. 3 shows an encapsulated package 32' in accordance with a first embodiment of the invention. The leadframe 10 is a composite structure having a core conductor 35 and a first polymer 42 coating at least a portion of the inner leads 18. A portion of the leadframe 10 is coated with a layer of the first polymer 42. Any polymer which adheres well to both copper and the molding resin may be used. Among the preferred polymers are polyimides, epoxies, acrylics and urethanes. Epoxies are most preferred due to the strong adhesive bonds which form and the thermosetting characteristics of the resin.

If a die attach paddle 24 is incorporated into the leadframe 10, the first polymer may cover the first 47 and second 44 major surfaces of the die attach paddle. Most preferably, the first polymer 42 coats at least the second major surface 44. The portion of the inner leads coated includes the entire section of the inner lead which is encapsulated within the molding resin 34 except for the inner lead tips 20. The first polymer may extend outwardly from the walls 46 of the package 32' to eliminate the formation of a leadframe/molding resin interface.

The inner lead tips 20 are preferably not coated with the epoxy layer 42 to facilitate bonding of bond wires 30. Aluminum or gold based bonding wires are usually joined to the leadframe by thermocompression bonding which requires a metal to metal interface. Copper foil leads such as used in tape automated bonding are joined by a similar technique. However, it is within the scope of the invention for the entire inner lead portion to be coated. The side of the inner lead tip opposite the bond wire may be coated. The polymer layer 42 may be deposited subsequent to wire or TAB bonding and coat the bond and entire inner lead tip 20.

The first major surface 47 of the die attach paddle 24 contacts the integrated circuit device 28 and may also be coated with a polymer. The selection of polymer on this surface is dependent on the requirements of the device 28. If the device is to be electrically isolated from the paddle, then any suitable nonconductive polymer may be used, such as the first polymer 42. If the paddle is to provide a ground or reverse voltage bias, then a second electrically conductive polymer is selected. A silver filled epoxy is an exemplary conductive polymer for the surface.

One suitable first polymer is a thermoplastic polyolefin such as polyethylene or polypropylene, preferably containing a grafted metal deactivator and primary antioxidant as disclosed in U.S. Pat. No. 4,812,896 to Rothgery et al. Other suitable first polymers include polyimides, epoxies, acrylics and urethanes.

The most preferred first polymer is an epoxy such as Hysol XEA9485NM manufactured by The Dexter Company (Pittsburg, Calif.). The epoxy layer is selected to have a thickness effective to coat the metal leadframe and die attach paddle. Preferably, the thickness is from about 0.0005 inches to about 0.020 inches and most preferably from about 0.001 inches to about 0.005 inches. The epoxy is applied either as a liquid or in sheet form.

If applied as a liquid, the leadframe is first degreased in a suitable solvent such as acetone or propanol. The portions of the inner leads which are to remain epoxy free are masked with a suitable masking agent. The leadframe is then dipped in a solution containing the epoxy dissolved in a solvent. The solvent is then evaporated depositing the polymer on the leadframe.

More preferably, the epoxy layer 42 is applied in sheet form. An epoxy preform having the desired dimensions is stamped. The leadframe 10 is then heated to a temperature sufficient to tack the epoxy. "Tack" is used in its conventional sense within the art. The epoxy is heated to a temperature sufficient to promote bonding to the leadframe but insufficient to initiate complete polymerization. For a 0.005 inch film, a suitable thermal profile for tacking is 3 minutes at 100° C. Complete bonding occurs during encapsulation and soldering.

The epoxy sheet may be cut or stamped into the desired shape. The sheet is held in place during tacking by any suitable fixturing means. Sheets of different polymers may be simultaneously tacked, if, for example, a conductive adhesive is required on the chip bonding face of the die attach paddle. High lead count leadframes (i.e. a quad leadframe having on the order of 200 leads) require a tie bar to prevent lead distortion or shorting during assembly. The epoxy sheet of the invention is capable of holding the leads in place eliminating the need for the tie bar.

Figure 4:
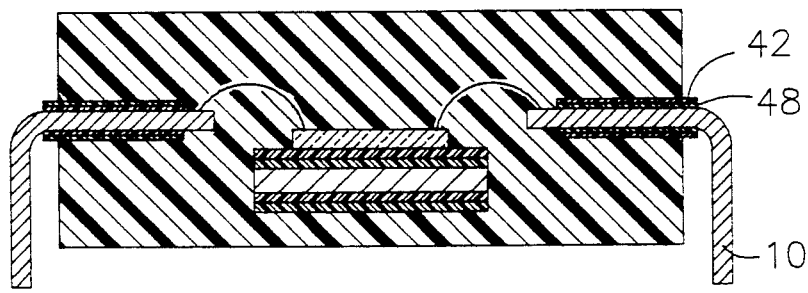
FIG. 4 shows in cross sectional representation a molded plastic electronic package including the composite leadframe of a second embodiment of the invention.

The epoxy 42 bonds more securely than the molding resin 34 to the metallic leadframe 10. The molding resin forms a secure bond to the epoxy 42. The bond between the molding resin and the composite leadframe which includes epoxy layers 42 is superior to that of the molding resin to the leadframe. While the composite leadframe illustrated in FIG. 3 is superior to the prior art, the strength of the adhesive bond may be further increased and the popcorn effect further reduced by disposing an adhesion enhancing layer between the leadframe and the epoxy layer as illustrated in FIG. 4.

An adhesion enhancing layer 48 is disposed between the leadframe 10 and the epoxy layer 42. The adhesion promoting layer 48 may be a roughened surface layer to enhance mechanical bonding. For example, certain copper alloys such C638 (nominal composition 95% by weight copper, 2.8% aluminum, 1.8% silicon and 0.4% cobalt) are capable of forming a refractory oxide layer in situ. By proper selection of temperature and the addition of a small amount of water vapor to the furnace atmosphere, a layer of alumina is formed on the surface of the copper alloy leadframe. Alternatively, a dull metal coating, such as nickel, may be deposited on the surface of the conductor by a process such as electrolytic deposition. Certain phosphate coatings are also known to enhance adhesion between copper and epoxy.

The adhesion promoting layer 48 may also be a polymer which chemically bonds to both copper and epoxy such as benzotriazole and benzothiazole. The adhesion promoting compound preferably includes a coupling agent which chemically bonds the compound to the leadframe. When the leadframe is copper or a copper alloy, suitable adhesion promoting layers include mercaptoester, 5-carboxy-benzotriazole, 5-(1-aminoethyl-amido)-benzotriazole and 5-amido-benzotriazole. Another suitable adhesion promoting compound is ethylene vinyl acetate. The thickness of the adhesion promoting layer is under about 500 angstroms. Preferably, the thickness of the layer is from about 20 to about 100 angstroms.

The advantages of the composite leadframes of the invention will become more clear from the examples which follow.

EXAMPLE 1

Leadframe coupons of copper alloy C194 (nominal composition by weight 97.5% copper, 2.35% iron, 0.3% phosphorous and 0.12% zinc) sized 3/16"×1.0"×0.010" were degreased in acetone or propanol and then pickled in sulfuric acid (12 weight percent at 50° C). Following rinsing and drying, the samples were oxidized at 250° C. in air at a 20°–25° C. dew point. The coupons were then divided into three groups. A first sample (designated "A" in Table 1 below) represented the prior art and was encapsulated without further pretreatment. The coupons were then partially encapsulated in an epoxy molding resin, Nitto 180B manufactured by (Nitto Denko Corp. of Osaka, Japan). Encapsulation comprised heating the resin with the partially embedded coupon to a temperature of 170°–190° C. for a time of 2.5–3.0 minutes at a pressure of 5000–6000 psi.

A second sample (designated "B" in Table 1) was cut to the same coupon size and then coated with the adhesion promoting compound. The compound was provided as a mixture of ethylene vinyl acetate/hexane-/acetone at the approximate ratio of 24,29 volume percent:20.02%:45.71%. The coupons were air dried. Following drying, the ethylene vinyl acetate thickness was about 40 angstroms. The coupons were encapsulated in the Nitto 180B resin.

A third set of samples (designated "C" in Table 1) was cleaned as above and then laminated on both sides with 0.005 inches of Hysol XEA9684 adhesive. The epoxy film was tacked at 100° C. for three minutes prior to encapsulation. The third set of coupons was then encapsulated in Nitto 180B resin.

Figure 5:
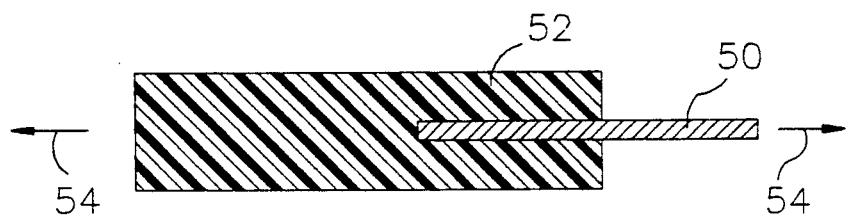
FIG. 5 shows in cross sectional representation a method for evaluating adhesion.

FIG. 5 illustrates how adhesion was evaluated. A leadframe coupon 50 was partially embedded in molding resin 52. A shear stress was applied by pulling the coupon 50 and molding resin 52 in opposing directions as generally indicated by stress arrows 54. Any suitable tensile testing apparatus such as those manufactured by Instron Corporation, Canton, Mass. may be used to apply the necessary shear stress. The force required to remove the test lead coupon 50 from the molding resin 52 was recorded. The higher the force, the better the adhesion between the molding compound 52 and the simulated lead 50.

To further evaluate the bond strength, the samples were aged by immersion in a pressure cooker at 121° in steam at a pressure of 14.7 psi. Exposure time under pressure was either 5 hours or 96 hours. The samples were then heated and solder coated to simulate soldering to a printed circuit board.

As illustrated in Table 1, the samples formed according to the process of the invention varied from 3 to 5 times superior in adhesion than leadframe samples cleaned according to conventional processes.

TABLE 1

SHEAR LOAD (PSI) TO REMOVE LEAD FROM MOLDING ENCAPSULANT

| | AS CURED | PRESSURE COOKER (5 HOURS) | PRESSURE COOKER (96 HOURS) |
|---|---|---|---|
| A | 330 | 300 | 270 |
| B | 1050 | 850 | 750 |
| C | * | * | 1050 |

* = shear stress in excess of 1500 psi, failure was within the copper coupon rather than at the resin/copper bond.

The example clearly shows the composite leadframes of the invention are superior to conventional metal leadframes in reducing the possibility of moisture penetration into the package. An adhesion promoting compound may be used alone as illustrated by Group B of the Table. Generally, the thickness of the adhesion promoting compound when used by itself will be from about 20 to about 100 angstroms. When used in combination with the first polymer, the thickness of the adhesion promoting compound should also be in the range of from about 20 to about 100 angstroms. It is believed even better results will be achieved by combining the adhesion promoting compounds with the epoxy coatings of Group C.

While the invention has been described in terms of a quad leadframe (leads approaching the central aperture from four sides), it is equally applicable to DIPs (leads approaching from two opposing sides) and SIPs (leads approaching from a single side) as well an any other conductor configuration.

Figure 6:
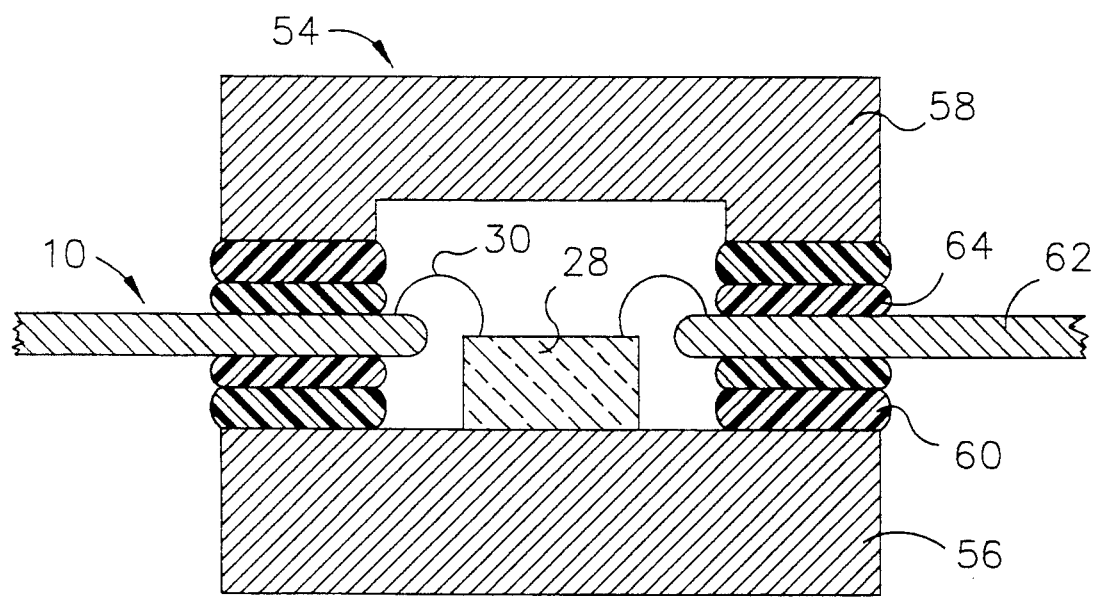
FIG. 6 shows in cross sectional representation a composite leadframe incorporated in a metal package in accordance with an embodiment of the invention.

While the invention has particular utility in molded plastic electronic packages, the concepts may be applied to an adhesively sealed metal package 54 as shown in FIG. 6. The metal package has metallic base 56 and cover 58 components joined together by a polymer adhesive 60 such as an epoxy. Preferably the metallic components are formed from copper, aluminum or alloys thereof to exploit the high thermal conductivity of those materials. Most preferably, an aluminum alloy such as alloy 3003 (nominal composition by weight 0.12% copper, 1.2% manganese and the balance aluminum) is used.

The leadframe 10 is a composite, comprising a conductor 62 and a first polymer 64. The first polymer is as described hereinabove and serves to promote adhesion between the conductor and the polymer adhesive 60. Typically, the first polymer will be in the form of a ring having peripheral dimensions defined by the area of contact between the conductor 62 and polymer adhesive However, the width of the first polymer may be either smaller or larger than the width of the polymer adhesive.

An integrated circuit device may be bonded directly to the base component 58 or attached to a centrally positioned die attach pad (not shown). The device is then electrically connected to the conductor by bonding wires 30.

The patents disclosed in the specification are intended to be incorporated herein by reference.

It is apparent that there has been provided in accordance with this intention a composite leadframe having improved adhesion to a molding resin which serves to reduce the popcorn effect in molded plastic packages and fully satisfies the objects, features and advantages set forth here and above. While the invention has been described in combination with specific embodiments, it is evident that many alternatives, modifications and variations will be apparent to those skilled in the art in light of the forgoing description. Accordingly, it is intended to embrace all such alternatives, modifications and variations as fall within the spirit and broad scope of the appended claims.

I claim:

1. A leadframe for an electronic package, comprising:
   a conductor having a plurality of leads with inner and outer portions, said inner portions defining a central aperture;
   a die attach paddle located within said central aperture and having first and second major surfaces, said first major surface adapted to receive an electronic device;
   a first polymer coating on at least a portion of said inner leads and on said second major surface of said die attach paddle; and
   a second polymer coating which is conductive on said first major surface of said die attach paddle.

2. The leadframe of claim 1 wherein said first polymer coats the entire inner lead portion except for the lead tips.

3. The leadframe of claim 1 wherein said conductor is a copper alloy.

4. The leadframe of claim 2 wherein said second polymer is a silver filled epoxy.

5. The leadframe of claim 2 wherein said first polymer is selected from the group consisting of polyolefins, polyimides, epoxies, acrylics and urethanes.

6. The leadframe of claim 5 wherein said first polymer is an epoxy.

7. The leadframe of claim 6 wherein said first polymer has a thickness of from about 0.0005 to about 0.020 inches.

8. The leadframe of claim 7 wherein said first polymer has a thickness of from about 0.001 to about 0.005 inches.

9. The leadframe of claim 8 wherein said first polymer is an epoxy sheet of a desired thickness tacked to said conductor.

10. The leadframe of claim 7 wherein an adhesion promoting layer is disposed between said first polymer and said conductor.

11. The leadframe of claim 10 wherein said adhesion promoting layer is selected from the group consisting of refractory oxides, dull nickel, phosphates, and polymers.

12. The leadframe of claim 11 wherein said adhesion promoting layer is a polymer selected from the group consisting of benzotriazole, benzothiazole, mercaptoester, 5-carboxy-benzotriazole, 5-(1-aminoethylamido)-benzotriazole, 5-amido-benzotriazole and ethylene vinyl acetate.

13. The leadframe of claim 12 wherein said adhesion promoting layer is ethylene vinyl acetate having a thickness of from about 20 to about 100 angstroms.

14. The leadframe of claim 1 wherein said first polymer is selected from the group consisting of benzotriazole, benzothiazole, mercaptoester, 5-carboxy-benzotriazole, 5-(1-amino-ethylamido)benzotriazole, 5-amido-benzotriazole and ethylene vinyl acetate.

15. The leadframe of claim 1 wherein said first polymer is ethylene vinyl acetate having a thickness of from about 20 to about 100 angstroms.

16. A leadframe for an electronic package, comprising:
   a conductor having a plurality of leads with inner and outer portions, said inner portions defining a central aperture;
   a die attach paddle located within said central aperture and having first and second major surfaces, said first major surface adapted to receive an electronic device; and
   a polymer coating at least a portion of said inner leads and the second surface of said die attach paddle, said polymer coating having a thickness from about 0.0005 to about 0.020 inches.

17. The leadframe of claim 16 wherein said conductor is a copper alloy.

18. The leadframe of claim 17 wherein said polymer coating is in the form of a preform tacked to both said inner portion of the leads and to said second surface of said die attach paddle.

19. The leadframe of claim 18 wherein said polymer is selected from the group consisting of polyolefins, polyimides, epoxies, acrylics and urethanes.

20. The leadframe of claim 19 wherein said polymer is an epoxy.

21. The leadframe of claim 20 wherein said polymer has a thickness of from about 0.001 to about 0.005 inches.

22. The leadframe of claim 20 wherein an adhesion promoting layer is disposed between said polymer and said conductor.

23. The leadframe of claim 22 wherein said adhesion promoting layer is selected from the group consisting of refractory oxides, dull nickel, phosphates, and polymers.

24. The leadframe of claim 23 wherein said adhesion promoting layer is a polymer selected from the group consisting of benzotriazole, benzothiazole, mercaptoester, 5-carboxy-benzotriazole, 5-(1-amino-ethylamido)-benzotriazole, 5-amido-benzotriazole and ethylene vinyl acetate.

25. The leadframe of claim 24 wherein said adhesion promoting layer is ethylene vinyl acetate having a thickness of from about 20 to about 100 angstroms.

26. The leadframe for an electronic package, comprising:
   a conductor having a plurality of leads with inner and outer portions, said inner portions defining a central aperture;
   a die attach paddle located within said central aperture and having first and second major surfaces, said first major surface adapted to receive an electronic device; and
   a polymer coating at least a portion of both said inner leads and said second major surface of said die attach paddle, said polymer selected from the group consisting of benzotriazole, benzothiazole, mercaptoester, 5-carboxy-benzotriazole, 5-(1-amino-ethylamido)-benzotriazole, 5-amido-benzotriazole and ethylene vinyl acetate.

27. The leadframe of claim 26 wherein said conductor is a copper alloy.

28. The leadframe of claim 27 wherein said polymer has a thickness of from about 0.0005 to about 0.020 inches.

29. The leadframe of claim 28 wherein said polymer has a thickness of from about 0.001 to about 0.005 inches.

30. The leadframe of claim 29 wherein said polymer is an epoxy sheet tacked to said conductor.

31. The leadframe of claim 28 wherein an adhesion promoting layer is disposed between said first polymer and said conductor.

32. The leadframe of claim 31 wherein said adhesion promoting layer is selected form the group consisting of refractory oxides, dull nickel, phosphates, and polymers.

33. The leadframe of claim 28 wherein said first polymer is ethylene vinyl acetate having a thickness of from about 20 to about 100 angstroms.

34. The leadframe of claim 32 wherein said first polymer is ethylene vinyl acetate having a thickness of from about 20 to about 100 angstroms.

* * * * *